United States Patent
Dobos et al.

(10) Patent No.: US 6,411,244 B1
(45) Date of Patent: Jun. 25, 2002

(54) PHASE STARTABLE CLOCK DEVICE FOR A DIGITIZING INSTRUMENT HAVING DETERMINISTIC PHASE ERROR CORRECTION

(75) Inventors: Laszlo Dobos, Beaverton; Raymond L. Veith, Hillsboro, both of OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 09/799,743

(22) Filed: Mar. 5, 2001

(51) Int. Cl.[7] .............................................. H03M 1/12
(52) U.S. Cl. ...................... 341/155; 341/122; 341/118; 327/237; 327/306; 327/160; 327/161; 327/162; 327/165; 302/262; 302/529
(58) Field of Search ................................. 341/155, 122, 341/118; 327/160, 161, 162, 165, 237, 356; 307/262, 529

(56) References Cited

U.S. PATENT DOCUMENTS

| | | |
|---|---|---|
| 5,402,019 A | 3/1995 | Drummond |
| 5,959,479 A | 9/1999 | Woodward |
| 5,959,563 A * | 9/1999 | Ring .......................... 341/155 |
| 6,069,578 A * | 5/2000 | Liu et al. ..................... 341/122 |
| 6,204,784 B1 * | 3/2001 | Hatfield ....................... 341/118 |

* cited by examiner

Primary Examiner—Michael Tokar
Assistant Examiner—Lam T. Mai
(74) Attorney, Agent, or Firm—William K. Bucher

(57) ABSTRACT

A phase stable clock circuit includes a phase gate having track-and-hold (T/H) circuits with each T/H circuit receiving a phase shifted continuous sinusoidal signal of predetermined phase and a control input signal to capture and hold phase samples of the sinusoidal signals. In alternative embodiments, a phase correction circuit provides phase correction values that are added to the held phase values to generate corrected phase values and time-error phase lookup table is used to generate time position correction values. The corrected phase values are applied to the phase gate remove deterministic phase errors to generate an output signal with a predetermined startup phase relative to the control input signal transition. The phase error-to-time lookup table adjusts the time placement of waveform record samples after the acquisition of the samples. An optional infinite track-and-hold circuit may be used to generate corrected replica phase values that replace the corrected phase values for longer sample delay periods.

28 Claims, 12 Drawing Sheets

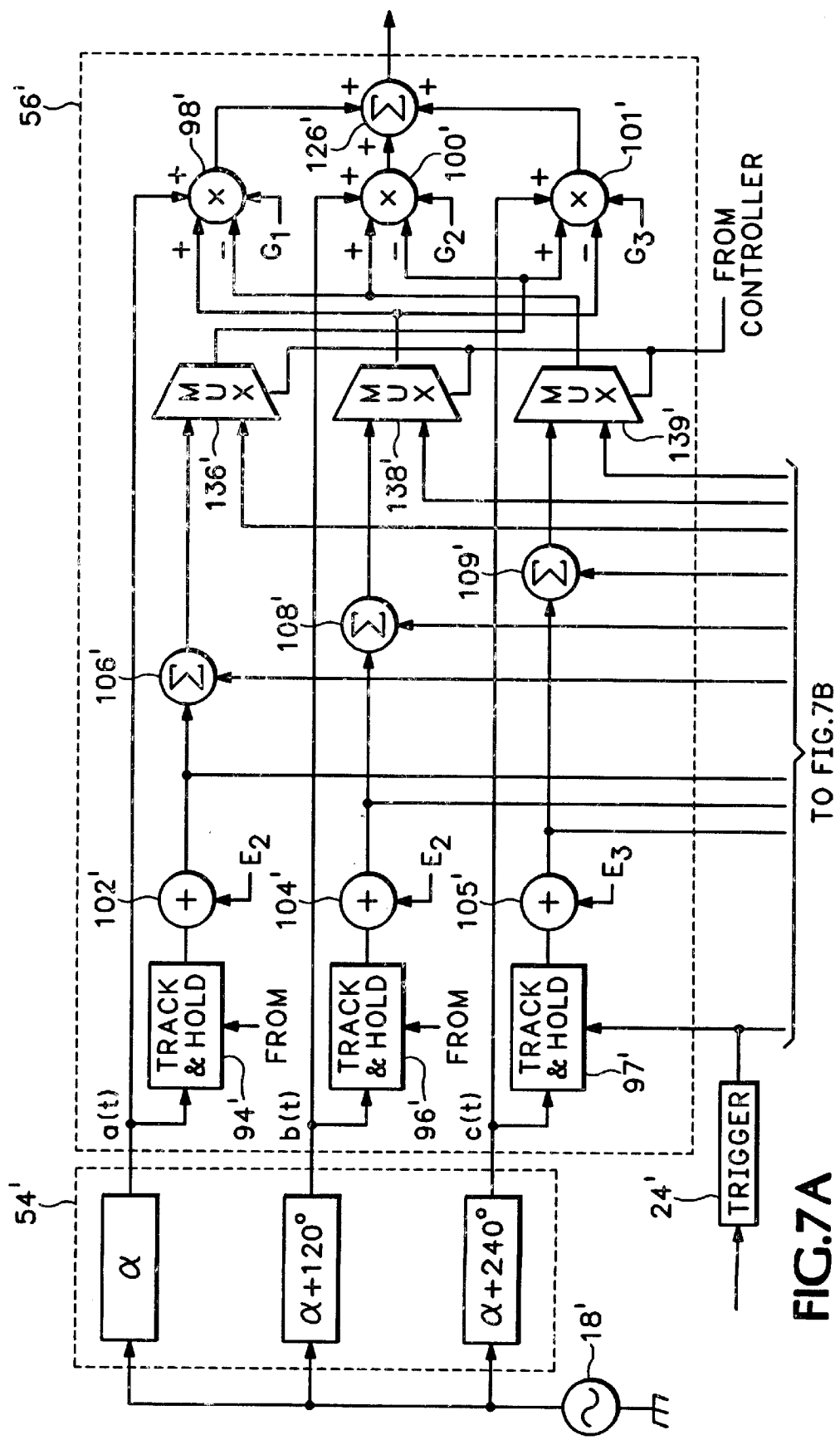

PHASE STARTABLE CLOCK DEVICE FOR A DIGITIZING INSTRUMENT HAVING DETERMINISTIC PHASE ERROR CORRECTION

BACKGROUND OF THE INVENTION

The present invention relates generally to phase startable clock devices and more particularly to a phase startable clock device for a digitizing instrument having deterministic phase error correction for improved jitter performance.

In a high speed digitizing instrument, an analog input signal is sampled and quantized during an acquisition interval under control of a sampling strobe signal. The sampling strobe signal may be, or may be derived from, a high frequency sinusoidal signal. It may be desired that the high frequency sinusoidal signal start with a known phase at a fixed time following a control signal transition that is representative of a trigger event. It is known to generate such a high frequency sinusoidal signal using a circuit known as a phase startable clock.

U.S. Pat. No. 5,402,019 describes a phase startable clock device having improved jitter performance and minimal start-up time delay. The phase startable clock device has a stable oscillator generating a sinusoidal signal that is applied to a phase splitter. The phase splitter outputs sinusoidal signals are in quadrature phase or 90° apart and have gains A and B. Matching of the gains A and B and having an exact quadrature relationship between the sinusoidal signals are not critical for operation of the device. Each phase shifted sinusoidal signal is coupled to a respective multiplier and track-and-hold circuit. A control transition signal from a control signal source in the form of a trigger signal is applied to each track-and-hold. The held phase values on the respective track-and-hold circuits are cross-coupled to the multipliers. The outputs of the multipliers are summed in a summing circuit to generate an output signal with a predetermined startup phase relative to the trigger transition.

In operation, the phase startable clock device generates a constant value at the output from the summing circuit when the track-and-hold circuits are tracking the phase shifted sinusoidal signals. When a trigger transition occurs, the track-and-hold circuits hold the phase values of the phase shifted sinusoidal signal. The phase values are applied to the multipliers which generate weighted sinusoidal signals based on the held phase values. The weighted sinusoidal signals are added together in the summing circuit to produce the output signal. The output of the phase startable clock device is used as a coarse time delay for a strobe generator. The strobe generator has a digital counter that is loaded with a coarse delay value from a controller. The output of the phase startable clock device is applied to the counter which increments or decrements the counter. The counter increments to a terminal count or decrements to zero whereupon a strobe pulse is generated and applied to an analog time interpolator circuit. The controller provides a digital threshold value to a digital-to-analog converter which converts the digital value to an analog threshold value which is applied to the interpolator circuit. The strobe signal from the counter initiates the generation of a ramp signal in the interpolator circuit. The interpolator circuit generates an output strobe pulse to a sampler circuit when the ramp signal equals the analog threshold value.

The almost instantaneous phase shift or synchronization of the sinusoidal signal phase to the external triggering event is not perfect due to nonlinear effects in the analog processing circuits in the phase startable clock device. The non-ideal circuit operation translates into systematic trigger to gated clock or strobe timing delay errors. What is needed is a phase startable clock device for a sampling time base in a digitizing instrument that reduces the residual time error or deterministic jitter error to more accurately acquire samples of an input signal.

SUMMARY OF THE INVENTION

Accordingly, the present invention is directed to a phase startable clock device and digitizing instrument having deterministic phase error correction. The phase startable clock device has a phase gate receiving phase shifted continuous sinusoidal signals. The sinusoidal signals are applied to respective track-and-hold circuits and multipliers. The track-and-hold circuits receive a trigger signal that captures and holds the phase values of the sinusoidal signal. The phase values are applied to phase correction circuitry and infinite track-and-hold circuitry. The phase correction circuitry has A/D converters that convert the analog phase values to digital phase values. The digital phase values are coupled to a phase pointer calculator that generates a phase pointer value derived from the digital phase values. The phase pointer indexes into phase lookup tables equaling in number the number of phase shifted continuous sinusoidal signals. The phase lookup tables output phase correction values that are applied to D/A converters. The digital-to-analog analog converters generate analog voltages representative of the phase correction values. The analog phase correction values are coupled to respective summing circuits with each circuit receiving the phase values held on the track-and-hold circuits. The summation circuits combine the respective phase correction values and the phase values and apply the resulting values to the inputs of the multiplier circuits. The multiplier circuits generate outputs that are summed together in a signal summation circuit to generate and output signal with a predetermined startup phase relative to the control input signal transition.

The optional infinite track-and-hold circuit includes A/D converters that receive the phase values held on the track-and-hold circuits. The A/D converters generate digital phase values that are coupled to a phase pointer calculation. The phase pointer calculator generates a phase pointer value that is used to index into phase lookup tables equaling in number the number of phase shifted continuous sinusoidal signals. The phase lookup tables output phase lookup correction values that are applied to a summation circuit that also receives the digital phase values. The summation circuit combines the respective digital phase values with the digital phase lookup correction values. The respective summed outputs of the summation circuit are coupled to D/A converters. The D/A converters generate analog voltage representative of corrected replica phase values of the phase values held on the track-and-hold circuits. The corrected replica phase values are applied to second input ports of respective multiplexers that receive the corrected phase value at their first input ports. The multiplexers selectively couple the corrected phase values to the multipliers during a first time period and the corrected replica phase values during a second time period.

The output of the phase startable clock device is a clock signal that is applied to a strobe generator. The strobe generator includes counter circuitry and interpolator circuitry. The strobe generator receives strobe delay input that loads the counter circuitry with a coarse delay value and the interpolator with a fine delay value. The clock from the phase startable clock device increments or decrements the counter until a terminal or zero count is reached whereupon a ramp strobe pulse is generated. The ramp strobe pulse initiates the generation of a ramp signal that is applied to the interpolator. The ramp continues until it reaches a threshold value defined by the fine delay value whereupon a sampling strobe is generated. The sampling strobe is used to strobe an input sampler that receives an input signal under test. The sampler acquires waveform samples of the signal under test. The waveform samples are stored in memory in time locations for later retrieval and processing.

In the preferred embodiment of the present invention, the phase startable clock device has a three phase gate. The three phase gate receives three phase shifted sinusoidal input signal at 0°, 120° and 240°. The phase gate circuitry is then provided with three track-and-hold circuits, three summation circuits and three multiplier circuits. The phase correction circuitry and the infinite track-and-hold circuitry also has three A/D converters, three phase lookup table and thee D/A converters.

A further alternative to the phase startable clock device is the replacement of the phase lookup correction table with a time-error versus phase lookup table. The time-error versus phase lookup table is used to reorder the acquired waveform samples in time after acquisition to remove the deterministic phase error existing in the clock device. For this to happen, the digitized phase values from the infinite track-and-hold circuit are associated with each sample in the recorded waveform. The time-error versus phase lookup table is used during the first time period of the phase startable clock device and the infinite track-and-hold is used during the second period of time.

The objects, advantages and novel features of the present invention are apparent from the following detailed description when read in conjunction with the appended claims and attached drawings.

BRIEF DESCRIPTION OF THE DRAWING FIGURES

DETAILED DESCRIPTION OF THE PREFERRED EMBODIMENT

In the following detailed description numerous specific details are set forth in order to provide a thorough understanding of the present invention. However, it will be understood by those skilled in the art that the present invention may be practiced without these specific details. In other instances well known methods, procedures, components, and circuits have not been described in detail so as not to obscure the present invention.

Part of the description will be presented in terms of operations performed by a phase startable clock device and a digitizing instrument, using terms such as data, values, signal samples, numbers and the like, consistent with the manner commonly employed by those skilled in the art to convey the substance of their work to others skilled in the art. As is well understood by those skilled in the art, these quantities take the form of electrical, magnetic, or optical signals capable of being stored, transferred, combined and otherwise manipulated through mechanical and electrical components of the startable clock device and the digitizing instrument; and the term digitizing instrument includes general purpose as well as special purpose data processing machines, systems, and the like, that are stand alone, adjunct or embedded.

Additionally, various operations will be described as multiple discrete steps in turn in a manner that is most helpful in understanding the present invention, however, the order of description should not be construed as to imply that these operations are necessarily order dependent, in particular, the order of their presentation.

Figure 1:
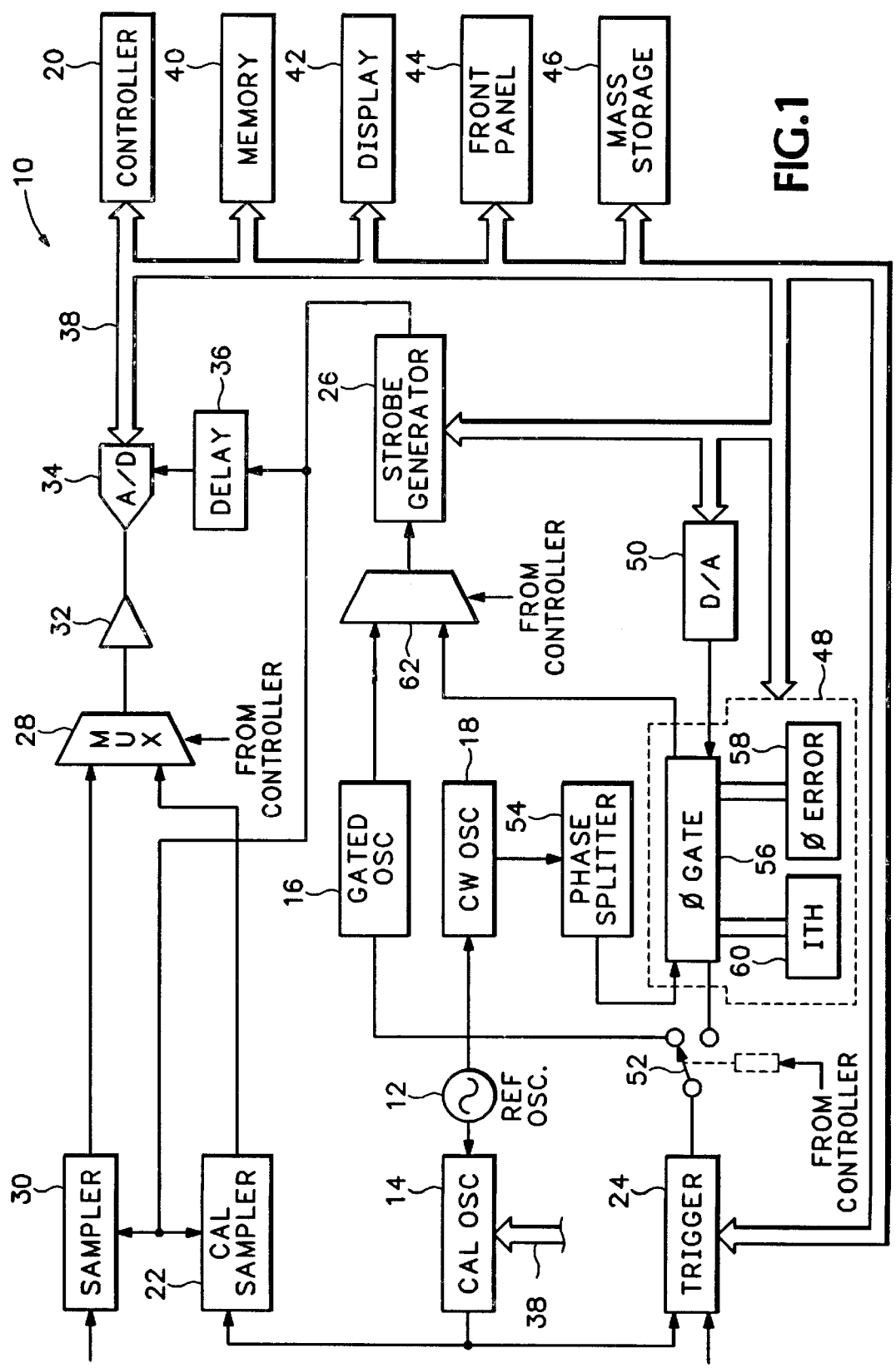
FIG. 1 is a representative block diagram of a digitizing instrument having the phase startable clock device with deterministic phase error correction according to the present invention.

Referring to FIG. 1, there is shown a representative block diagram of a digitizing instrument 10 having the phase startable clock device of the present invention. The digitizing instrument 10 has a reference oscillator 12 that is coupled to calibration oscillator 14 and a continuous wave oscillator 18. The calibration oscillator 14 is preferably a programmable frequency synthesizer locked to the reference oscillator 12. The calibration oscillator 14 generates a periodic output signal in response to inputs received from a controller 20. The calibration oscillator output is coupled to a calibration sampler 22 and a trigger circuit 24. The calibration sampler 22 includes sampling diodes that are strobed in response to strobe pulses from a strobe generator 26. The calibration sampler 22 may include strobe shaping circuitry that shapes the strobe pulses and generates differential strobe pulses. The sampled calibration signal is held by a track-and-hold circuit in the calibration sampler and coupled to one input of a multiplexer (MUX) 28. A second input to the MUX 28 receives held signal samples from an input signal sampler 30. The signal sampler 30 receives an optical or electrical input signal that is coupled to sampling diodes within the sampler 30. The input signal is sampled in response to sampling strobes from a strobe generator 26. As with the calibration sampler 22, the input sampler may include strobe shaping circuitry that shapes the strobe pulses and generates differential strobe pulses. A track-and-hold circuit within the sampler 30 holds the sampled signal. Alternately, the strobe generator 26 may include the shaping and differential circuitry for the strobe pulses.

The MUX 28 receives control signals from the controller 20 that selectively couples the held input signal samples or the held calibration signal samples to a buffer amplifier 32 via the MUX output. The buffer amplifier 32 conditions the samples for input to an analog-to-digital (A/D) converter 34. The A/D converter 34 is clocked relative to the strobe pulses from the strobe generator 26, such as by delayed strobe pulses coupled through a delay circuit 36. The digitized samples at the output of the A/D converter 34 are coupled to a system bus 38 and stored in system memory 40 for further processing and displaying.

System memory 40 includes both RAM, ROM and cache memory with the RAM memory storing volatile data, such as the digitized values representative of the input signal or the calibration signal, offset and gain correction values, lookup tables and the like. The system bus 38 couples memory 40 to the controller 20, such as PENTIUM® or Celeron™ microprocessor, manufactured and sold by Intel, Corp., Santa Clara, Calif. The system bus 38 is also coupled to a display device 42, such a liquid crystal display, cathode ray tube or the like, and front panel controls 44 with buttons, rotatable knobs and the like and/or control entry devices, such as a keyboard and/or mouse. A mass storage unit or units 46, such as a hard disk drive, a CD ROM drive, a tape drive, a floppy drive or the like, that reads from and/or writes to appropriate mass storage media, may also be connected to the system bus 38. Program instructions that control the functions of the digitizing instrument 10 may be stored and accessed from the ROM memory 40 or from the mass storage media of the mass storage unit 46. The digitizing instrument 10 in the preferred embodiment of the invention is a PC based system functioning under the overall control of WINDOWS® 98 operating system, manufactured and sold by Microsoft, Corp., Redmond, Wash. Controller 20 and system bus 38 in the block diagram are representative of multiple controllers and busses used in the digitizing instrument 10. A separate controller is used to control the acquisition of digitized samples with DSP controllers processing the signal samples and passing the processed samples to the control processor for display on display device 42.

The system bus 38 is also coupled to the strobe generator 26, the trigger circuit 24, a phase startable clock device 48, and a digital-to-analog (D/A) converter 50. The trigger circuit 24 is also coupled to receive an external trigger signal in addition to the calibration oscillator output signal. The trigger circuit 24 selectively generates a trigger gate, under program control, relative to the external trigger signal or the calibration oscillator signal. The trigger gate signal is coupled through a switching element 52 to the phase startable clock device 48 or a gated oscillator 16. The phase startable clock device 48 also receives phase shifted sinusoidal signals from the continuous wave oscillator 18 via a phase splitter 54. The phase shifted sinusoidal signals are coupled to a phase gate 56 in the phase startable clock device 48. The phase gate 56 also receives the trigger signal from the trigger circuit 22. A phase correction circuit 58 and infinite track-and-hold circuit 60 receive phase values from the phase gate 56 and respectively couple corrected replicas of the phase values and phase correction values back to the phase gate 56. The phase startable clock device 48 is coupled to the controller 20 via the system bus 38. A D/A converter 50 is coupled to the controller 20 via the system bus 38 for receiving digital offset and gain correction values that are converted to analog values and applied to the phase gate 56 to provide offset and gain correction to the phase startable clock device 48. In the preferred embodiment, the gain and offset correction values are provided by separate D/A converters.

The phase startable clock device 48 generates an output signal having a predetermined phase relative to the trigger input signal. The output signal is conditioned as a clock signal and coupled to one input of a multiplexer or switching circuit 62. The other input of the switching circuit receives a gated clock signal from the gated oscillator. The switching circuit 62 selectively couples the gated or phase controlled clock signal to the strobe generator 26 for establishing a coarse time delay marker relative to the trigger pulse.

Figure 2:
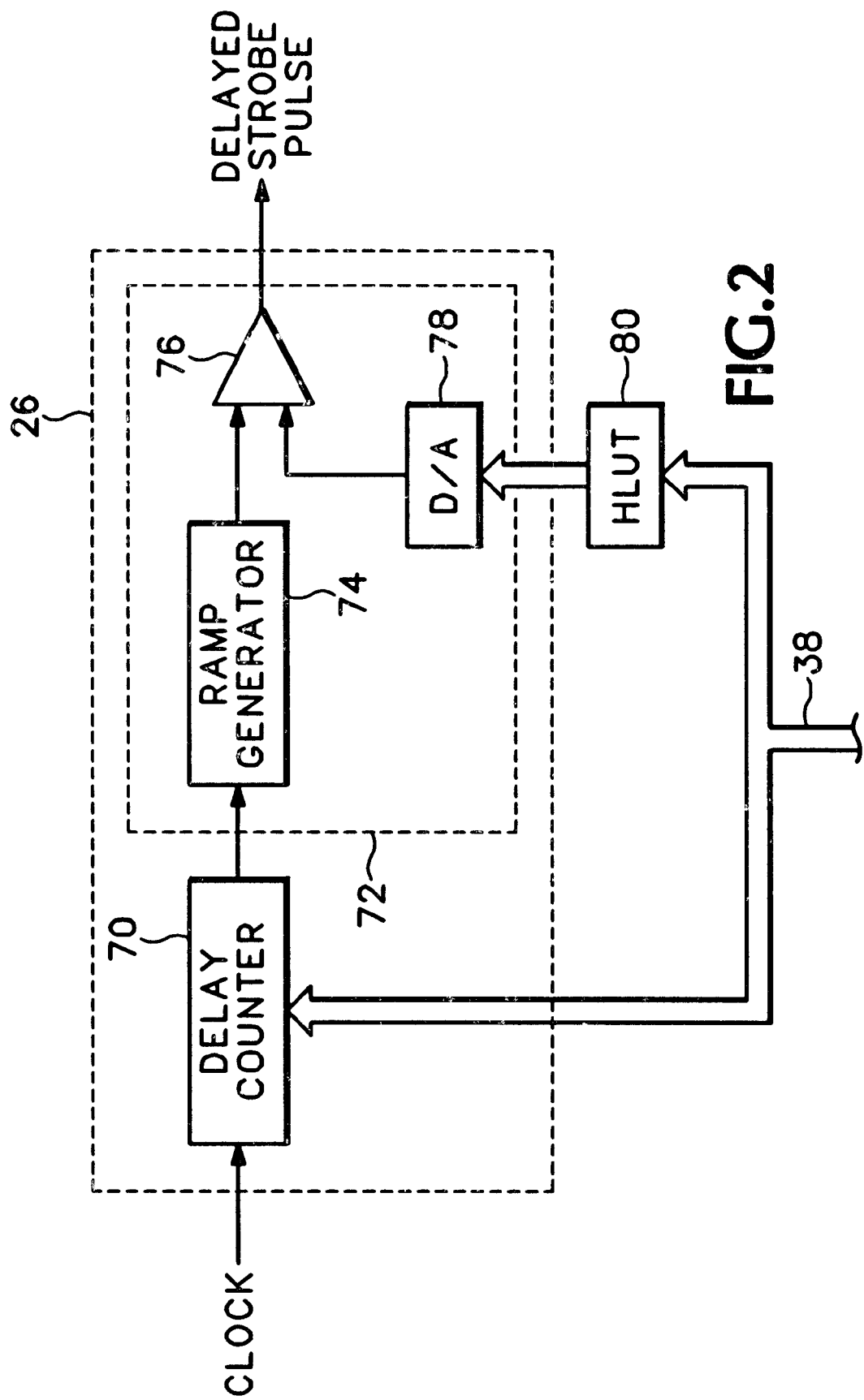
FIG. 2 is a representative block diagram of the strobe generator in the digitizing instrument having the phase startable clock device with deterministic phase error correction according to the present invention.

Referring to FIG. 2, there is shown a representative block diagram of the strobe generator 26. The strobe generator includes delay counter circuitry 70 coupled to receive the clock signal from either the phase startable clock device 48 or the gated oscillator 16. The counter circuitry 70 is coupled via the system bus 38 to the controller 20 that loads coarse time delay values into the counter 70. The output strobe from the delay counter 70 is coupled to a time interpolator circuit 72. In the preferred embodiment of the invention the interpolator circuit generates a 0–3 ns time delay change. The interpolator circuit has a ramp generator 74 that receives the output of the delay counter 70. The ramp generator 74 initiates a ramp signal that is coupled to the minus input of a comparator circuit 76. The plus input to the comparator circuit 76 is an analog signal from a digital-to-analog converter 78. The D/A converter 78 is a 14 bit device, but could be 16 or 18 bits, that receives digital-to-analog converter (DAC) code values from a horizontal lookup table (HLUT) 80. The generation of the HLUT 80 is described in co-pending patent application, Ser. Nos., 09/79942, filed on Mar. 5, 2001, titled "A Timebase Calibration Method for an Equivalent Time Sampling Digitizing Instrument", filed concurrently herewith and assigned to the assignee of the instant invention and incorporated in its entirety by reference herein. In the preferred embodiment of the invention, the coarse and fine time delay values are 48-bit fractional words. The upper 30 bits form the integer portion whose units are in strobe delay counter clock cycles, which are provided to the delay counter. The lower 18 bits form the fractional part converted into DAC codes values using the HLUT 80. The fractional part has 18 bits to support adequate resolution. The HLUT 80 contains DAC values that correct for non-linearities in the interpolator circuit 72. The locations of the fractional part DAC code values are found within the ranges of the corrected DAC code values in the HLUT 80 and interpolated over the found ranges to generate the corrected DAC code to the D/A converter 78. The corrected DAC codes are converted to analog values by the D/A converter 78 and applied to the plus input of the comparator circuit 76. The comparator circuit 76 generates strobe pulses when the ramp signal crosses the analog voltage level on the plus input. The output of the interpolator circuit 72 are strobe pulses that drive the sampling diodes in the calibration sampler 22 and the input signal sampler 30.

Figure 3:
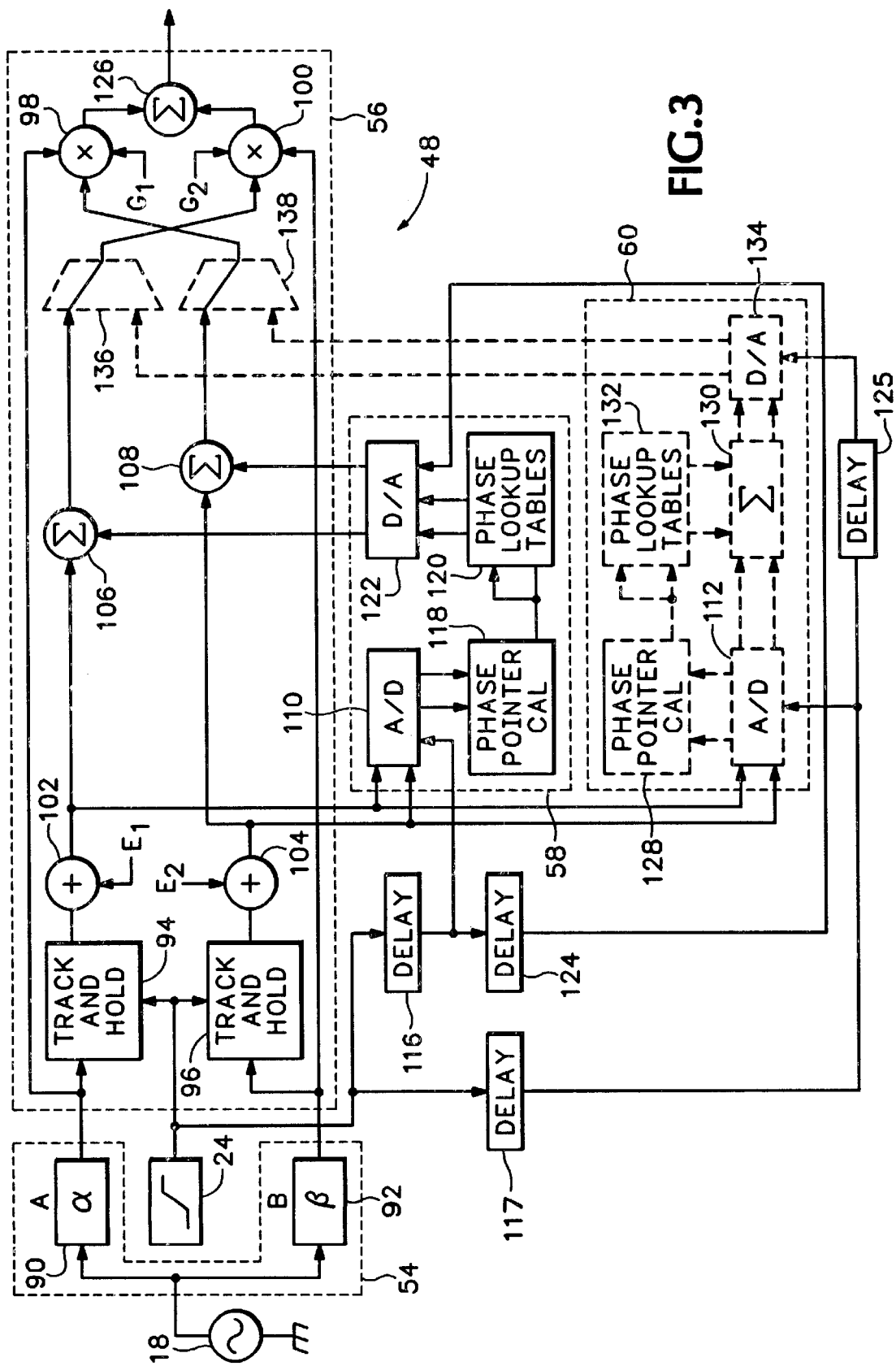
FIG. 3 is a representative block diagram of a first implementation of the generalized phase startable clock device with deterministic phase error correction according to the present invention.

FIG. 3 is a block diagram of a first embodiment of the phase startable clock device 32 of the present invention. Like elements as illustrated in FIG. 1 are labeled the same. The sinusoidal signal from the continuous wave oscillator 18 is applied to the phase splitter 54 that includes phase shifters 90 and 92. The phase shifter 90 has a gain of A and imposes a phase shift a, and the phase shifter 92 has a gain of B and imposes a phase shift β. The phase difference between phase shifted sinusoidal signals is approximately in quadrature phase but need not be exactly 90° apart for the invention to work. Neither do the gains need to be are exactly equal for the invention to work. The phase shifted sinusoidal signals are respectively applied to track-and-hold circuits 94 and 96 and multiplier circuits 98 and 100 in phase gate 56. The track-and-hold circuits 94 and 96 receive a control input signal from the trigger circuit 24. Summing circuits 102 and 104 are coupled to the respective outputs of track-and-hold circuits 94 and 96 for providing offset correction values to the track-and-hold outputs. The offset corrected outputs of the track-and-hold circuits 94 and 96 are applied to summation circuits 106 and 108 and the phase correction circuit 58 and infinite track-and-hold circuit 60.

The held values on the track-and-hold circuits 94 and 96 are coupled to respective analog-to-digital (A/D) converters 110 in the phase correction circuit 58 and analog-to-digital (A/D) converters 112 in the infinite track-and-hold circuit 60. The A/D converters 110 and 112 generate digital values representative of the phase values held on the output of the track-and-hold circuits 94 and 96. A/D converters 110 and 112 may be clocked by the output of the trigger circuit 24 after an appropriate amount of delay. The delay for the phase correction circuit 58 is substantially shorter than the delay for the infinite track-and-hold circuit 60 as will be described in greater detail below. This difference is represented by separate delays 116 and 117 for phase correction circuit 58 and the infinite track-and-hold circuit 60. A phase pointer calculator 118 in the phase correction circuit 58 receives the digital phase values and generates a phase pointer value derived from the digital phase values. Separate phase lookup tables 120, one for each phase of the continuous sinusoidal signal, receive the pointer as an index into the respective tables. Each phase lookup table outputs a phase correction value based on the pointer index. The phase correction values from the tables 120 are coupled to digital-to-analog converters 122 that generate analog voltage values representative of the phase correction values. The digitized values are loaded into the D/A converters 122 in response to a clock signal that may be clocked by the output of the trigger circuit after an appropriate amount of delay as represented by delay 124. The D/A converters 122 generate analog voltages representative of the phase correction values that are coupled to the appropriate summation circuits 106 and 108. The summation circuits 106 and 108 sum the phase values from the track-and-hold circuits 94 and 96 with the appropriate phase correction values to generate corrected phase values. The corrected phase values from the summation circuits 106 and 108 are coupled to the multipliers 98 and 100. The output of summation circuit 106 is applied to the multiplier 100 and the output of summation circuit 108 is applied to multiplier 98. Cross-multiplying the in-phase and quadrature phase correction values eliminates the effects of amplitude and phase errors in the phase shifted output signals of the phase shifters 90 and 92 The multipliers 98 and 100, which in the preferred embodiment are four-quadrant multiplier circuits, multiply their phase shifted sinusoidal inputs with the received phase correction values from the summation circuits. Each multiplier further receives a gain correction value. The output signals from multipliers 98 and 100 are coupled to a signal summation circuit 126 that sums the outputs together to produce an output signal having a predetermined startup phase relative to the trigger transition.

In the embodiment of FIG. 3, the infinite track-and-hold circuit 60 is an optional circuit that may be used in conjunction with the phase correction circuit 110 and is therefore shown with dashed lines. The digital phase values generated by A/D converter 112 in the infinite track-and-hold circuit 60 are coupled to a phase pointer generator 128 and a digital summation circuit 130. The phase pointer calculator 128 generates a phase pointer value derived from the digital phase values and representative of the phase of the continuous wave oscillator signal at the time of the control signal input from the trigger circuit 24. Separate phase lookup tables 132, one for each phase of the continuous sinusoidal signal, receives the pointer as an index into the respective tables. Each phase lookup table outputs a phase correction value based on the pointer index. The phase correction values from the tables 132 are coupled to the digital summation circuit 130. The digital summation circuit 132 may be a series of program steps stored in memory and implemented by the controller 20 in which the digital phase values from the analog-to-digital converters and combined with the respective phase correction values from the phase lookup tables. The digital phase corrected values are applied to the digital-to-analog (D/A) converters 134. The digitized values are loaded into the D/A converters 134 in response to delayed clock signal from delay 125. The D/A converters 134 generate analog voltages representative of corrected replica phase values.

The infinite track-and-hold circuit 60 provides stable replicas of the held phase values from the track-and-hold circuits 94 and 96 at the trigger signal transition Because the hold capacitors in the track-and-hold circuits 94 and 96 tend to discharge over time, changes in the held values affect the output of the phase gate, which in turn affects the timing accuracy of the strobe pulses, which in turn affects the timing accuracy of the signal samples of the input signal. In the preferred embodiment, the held phase value and the corrected phase value from the summation circuits 106 and 108 are coupled to the multipliers 98 and 100 via multiplexers 136 and 138 during a first time period which ranges from 0 to approximately 10 μs in the preferred embodiment. The duration of the time period is by example only and other time periods may be used without departing from the scope of the present invention. At the transition to a second time period, the multiplexers receive a control signal from the controller 20 that couples the corrected replica phase values from the infinite track-and-hold circuit 60 to the multipliers 98 and 100 via the multiplexers 136 and 138. The held phase value and the corrected phase value from the summation circuits 106 and 108 are coupled to the first ports of the appropriate multiplexers 136 and 138. The held phase value and the corrected phase value at the first input ports of the multiplexers 136 and 138 are coupled to their respective output ports during a first time period. The multiplexers are transitioned to their respective second input ports at the start of the second time period are held there until the time base is reset for the next trigger event. The corrected replica phase values are coupled from the second input ports of the multiplexers to the multipliers 98 and 100 via their respective output ports. The phase startable clock device and the infinite track-and-hold circuit are described in co-pending patent application, Ser. No. 09/799786, filed Mar. 5, 2001, titled "A Phase Startable Clock Device Having Improved Stability", filed concurrently herewith and assigned to the assignee of the instant invention and incorporated in its entirety by reference herein.

The deterministic phase error in the phase gate is characterized by programming the calibration oscillator 14 to a frequency that slightly different from the continuous wave oscillator 18. The relative phase changes between the oscillator frequencies in time allows the generation of samples at multiple phases over a 360° range. The sampling instrument is set up to acquire waveform record samples of the calibration oscillator signal using the calibration sampler 22 that is strobed by the strobe generator 26. The calibration oscillator signal is also used as the trigger signal. For each trigger transition, a waveform sample is acquired along with the phase values of the phase shifted sinusoidal signal applied to the phase gate 56 using the track-and-hold circuits 94 and 96. The held phase values are digitized by the A/D converters 110 in the phase correction circuit 58. The waveform samples are correlated with the corresponding phase samples to determine the timing errors. The timing errors are the result of the deterministic phase error of the phase gate. The timing errors are converted to phase values that correct for the deterministic errors in the phase gate. The phase error values are scaled to digital-to-analog converter codes indexed to the phase of the continuous wave oscillator and stored in the phase lookup tables. The deterministic phase error in the phase gate needs to characterized separately for the infinite track-and-hold circuit 60 to generate the phase lookup table 132.

Figure 4:
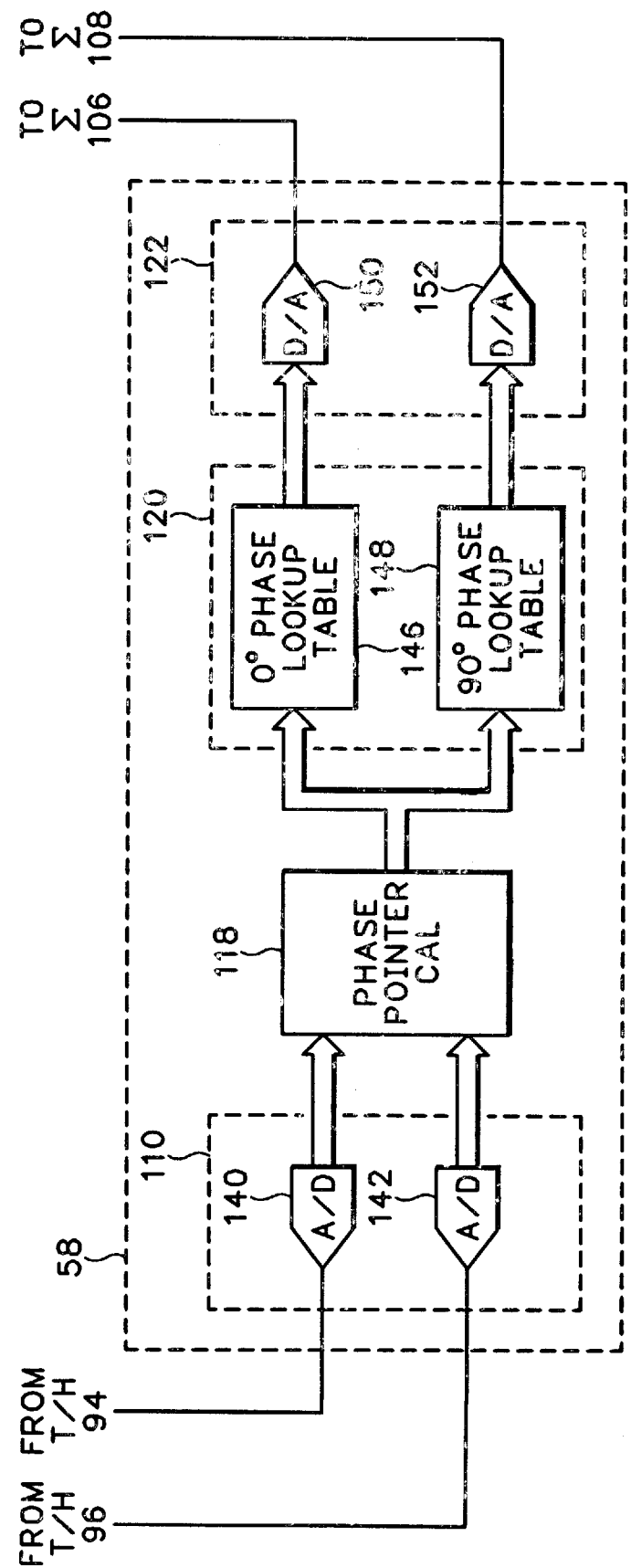
FIG. 4 is a representative block diagram of the phase correction circuit in the generalized phase startable clock device with deterministic phase error correction according to the present invention.

Referring to FIG. 4, there is shown representative block diagram of the phase correction circuit 58. Like elements in the figure are labeled the same as in FIGS. 1 and 3. The phase correction circuit needs to be a high speed device requiring its implementation as a hardware device. The phase correction circuit 58 has first and second A/D converters 140 and 142 that are respectively coupled to receive the phase values at the output of the track-and-hold circuits 94 and 96. The A/D converters 140 and 142 respectively generate digital values representative of the held values at the outputs of the track-and-hold circuits 94 and 96. The digital phase values are provided to the phase pointer calculator 118. The phase pointer calculator 118 generates a phase pointer value derived from the digital phase values of the analog-to digital converters 140 and 142. The phase pointer value is related to the phase of the continuous wave oscillator signal and may be calculated using trigonometric functions. The phase point value is used as an index into the phase lookup table 120. The phase lookup table 120 includes separate tables for each phase shifted sinusoidal signal. In the circuit of FIG. 3, the phase shifted sinusoidal signal are in quadrature phase which is taken to be 0° and 90°. 0° and 90° phase lookup tables 146 and 148 are derived from acquired waveform record of a calibration signal and the digital phase values corresponding to each of the acquired samples in the waveform record. The phase lookup tables are generated prior to measuring a signal under test and loaded into flash memory in the hardware device. The phase correction value in the phase lookup table 146, indexed by the phase pointer index value, is output to D/A converter 150 and the phase correction value in the phase lookup table 148, indexed by the phase pointer index value, is output to D/A converter 152. The D/A converters 150 and 152 convert the respective phase correction values to analog voltages that are coupled to summation circuits 106 and 108 respectively.

Figure 5:
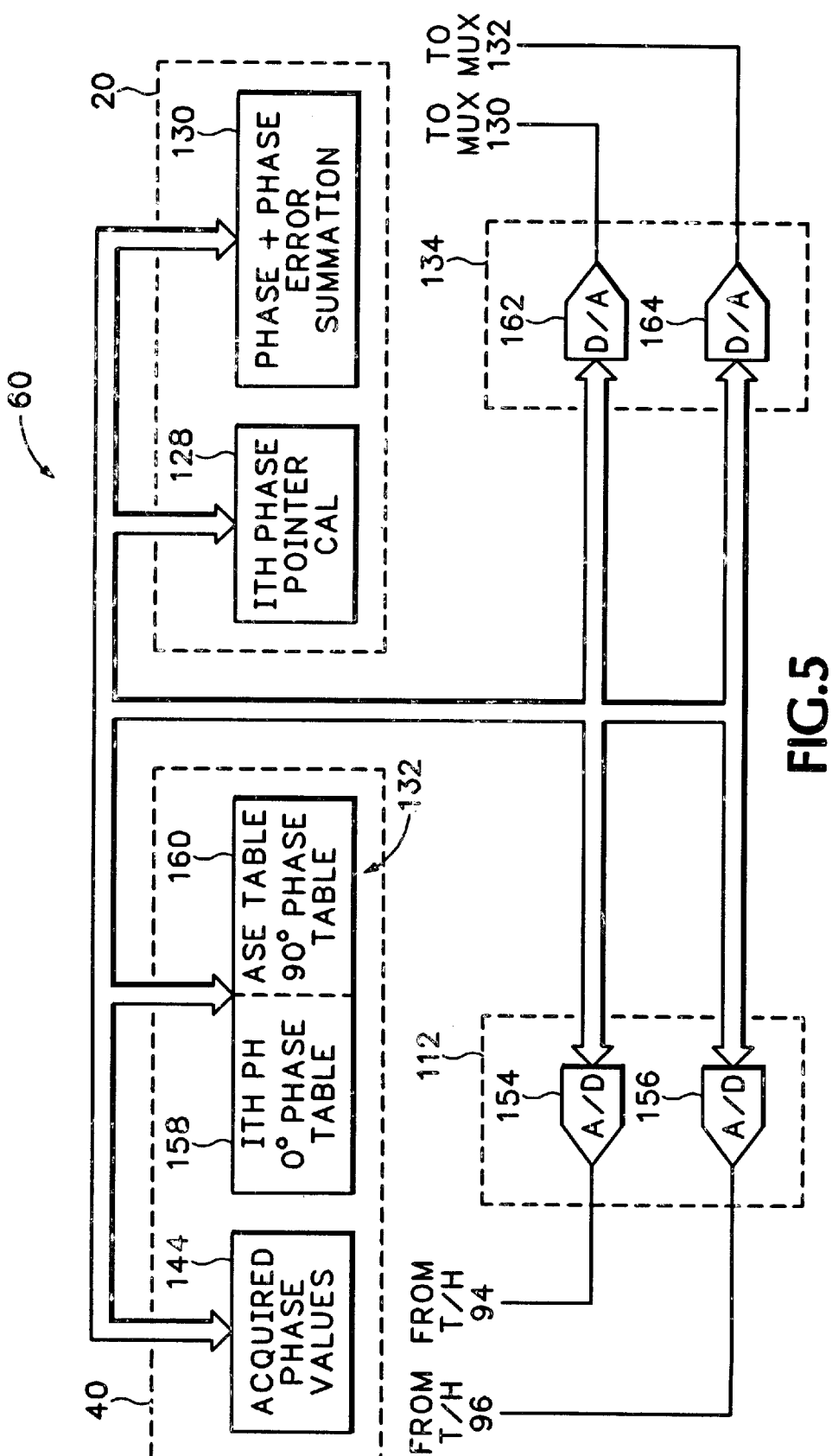
FIG. 5 is a representative block diagram of the infinite track-and-hold circuit in the generalized phase startable clock device with deterministic phase error correction according to the present invention.

The infinite track-and-hold circuit 60 in FIG. 5 has first and second A/D converters 154 and 156 that are respectively coupled to receive the phase values at the output of the track-and-hold circuits 94 and 96. The A/D converters 154 and 156 respectively generate digital values representative of the held values at the outputs of the track-and-hold circuits 94 and 96. The respective digital phase values are coupled via the system bus 38 to the acquired phase value memory 144 in memory 40 and stored. The digital phase values from the respective A/D converter 154 and 156 are read out of phase value memory 144 and the infinite track-and-hold phase pointer calculator 128. The infinite track-and-hold phase pointer calculator 128 may be implemented by the controller 20 using a series of program steps stored in memory. The phase pointer calculator 128 generates a pointer value derived from the digital phase values and representative of the phase of the continuous wave oscillator signal at the time of the control signal input from the trigger circuit 24. The phase pointer value is used as an index into the phase lookup table 132. The phase lookup table 132 includes 0° and 90° tables 158 and 160. The phase pointer index value is applied to the phase lookup tables 158 and 160 via the system bus 38. The phase correction values from the respective phase lookup tables are coupled via the system bus 38 to summation circuit 130. The stored phase values in phase value memory 144, corresponding the digital phase values from the A/D converters circuit 154 and 156, are also coupled via the system bus 38 to the summation circuit 130. The summation circuit 130 may be implemented by the controller 20 as a series of program steps stored in memory which sums the digital phase values from the A/D converters 154 and 156 with the respective phase correction values from the phase lookup tables 158 and 160. The resulting corrected replica phase values are coupled via the system bus 38 to respective D/A converter 162 and 164. The D/A converters 162 and 164 generate analog voltages representing the digital corrected replica phase values. The respective analog voltages are coupled to the second input ports of the multiplexers 136 and 138.

Figure 6:
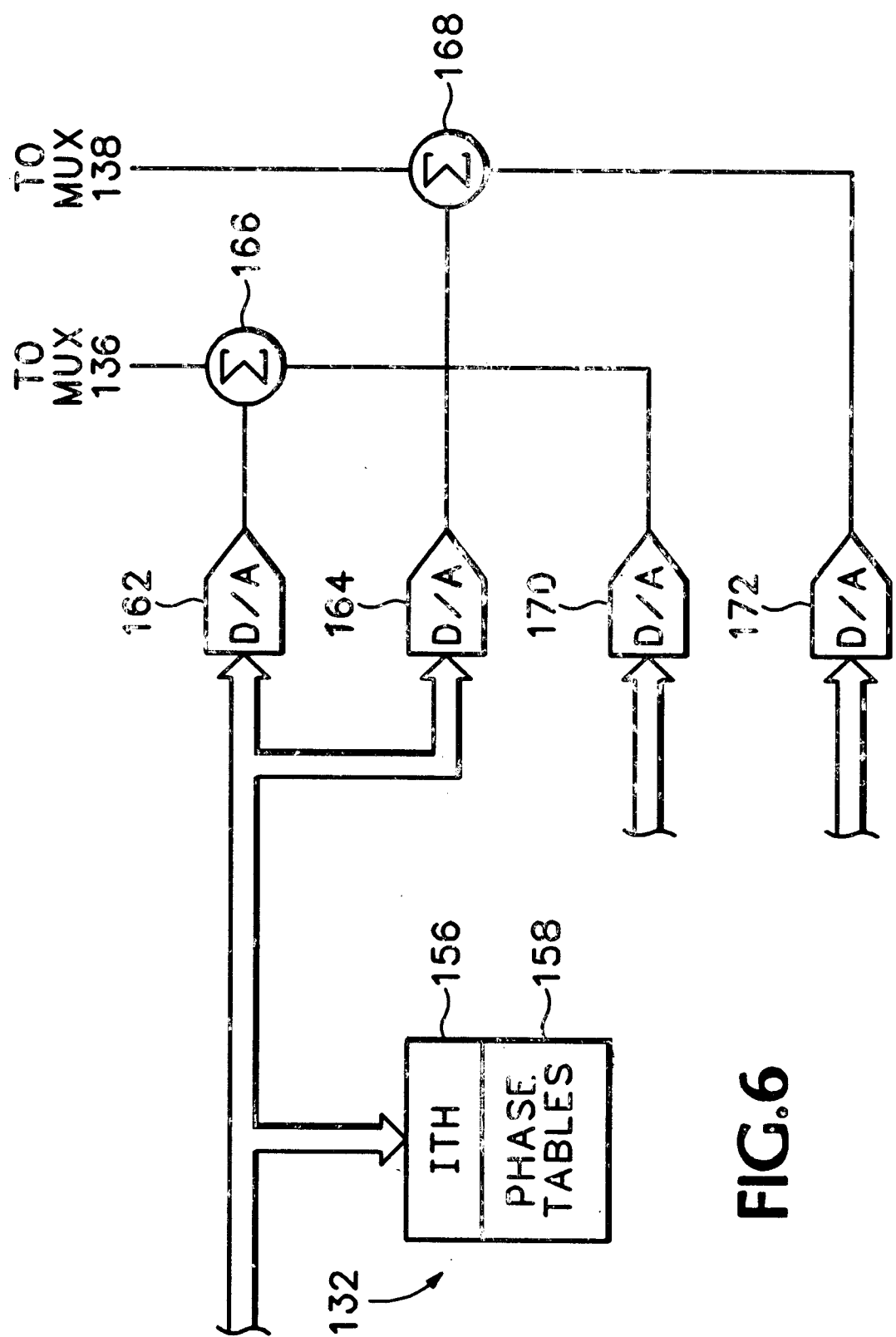
FIG. 6 is an alternative embodiment for generating the corrected replica phase values in the generalized phase startable clock device with deterministic phase error correction according to the present invention.

FIG. 6 illustrates a further embodiment for generating the corrected replica phase values. The phase lookup correction values from the phase lookup tables 158 and 160 are coupled via the system bus 38 to respective digital-to-analog converters 162 and 164. The D/A converters 162 and 164 generate respective analog voltages of the phase lookup correction values and couple the voltages to respective summation circuits 166 and 168. The digital phase values representative of the held phase values are coupled to D/A converters 170 and 172 which generate analog voltage replicas of the digital phase values. The output of the D/A converters 170 and 172 are respectively coupled to the summation circuits 166 and 168. The summation circuits 166 and 168 combine the analog voltages on their respective inputs and output corrected replica phase values to the multiplexers 136 and 138.

Figure 7B:
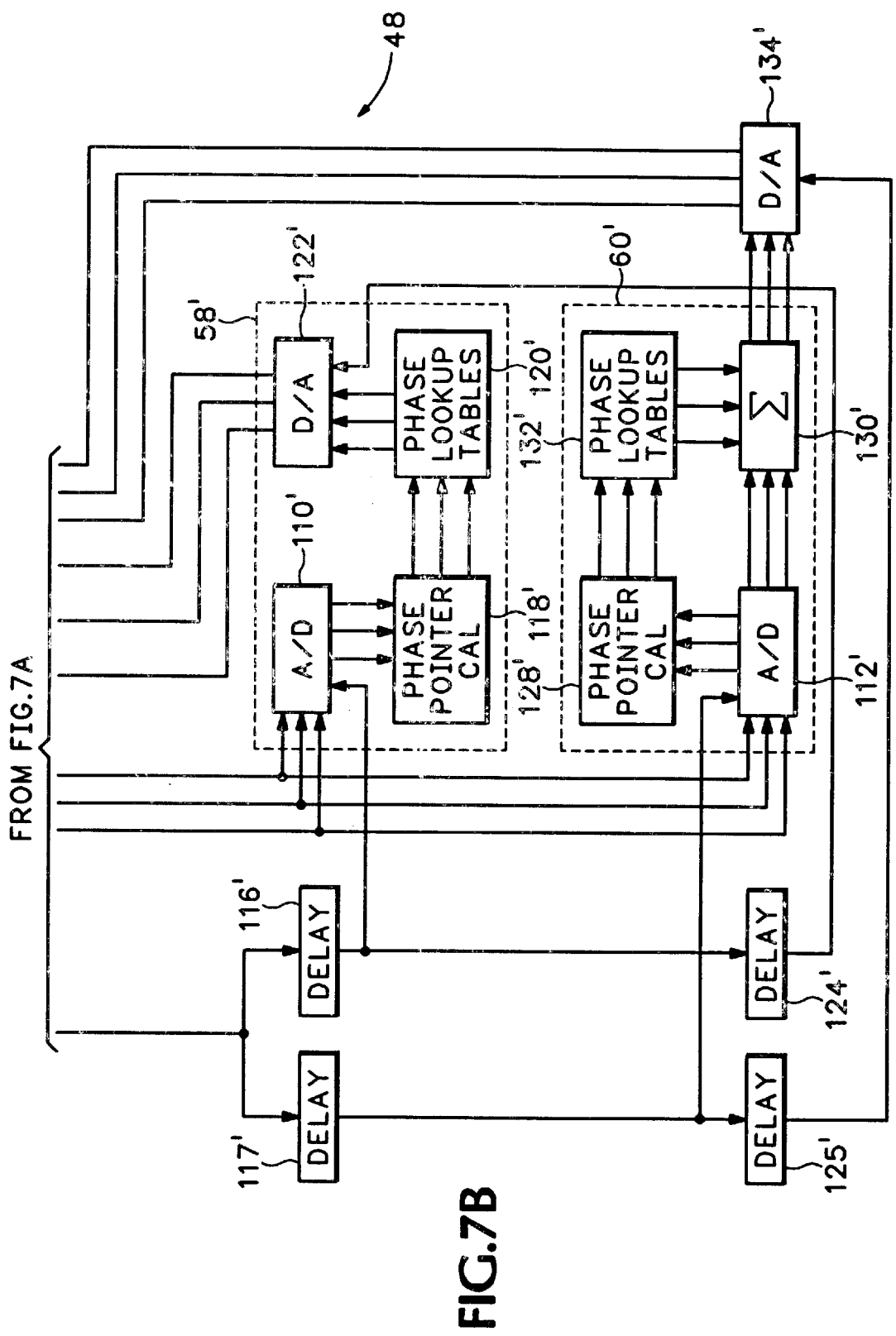
FIG. 7 is a representative block diagram of an alternative embodiment of the phase startable clock device with deterministic phase error correction according to the present invention.

The present invention is not restricted to the phase splitter providing only two output signals, and it is applicable to phase splitters having any number of output phases. By way of example, FIG. 7 shows a phase startable clock device 48 in which the sinusoidal signal from the continuous wave oscillator 18' is split into three phases which are then processed and recombined. The device also shows the optional infinite-track-and-hold circuit 60 connected into the device 48'.

In the device shown in FIG. 7, the continuous wave oscillator 18' is coupled to a three-phase-splitter 54'. The phase splitter 54' produces three output signals a(t), b(t) and c(t) at its outputs. The output signals are separated in phase from each other by approximately 120°. As was previously stated, the phase differences between the phase shifted sinusoidal signals need not be exactly the same for the invention to work. The first output of the phase splitter a(t) is applied to track-and-hold circuit 94' and to the continuous input of the multiplier 98'. The second output b(t) is applied to track-and-hold circuit 96' and to the continuous input of the multiplier 100'. The third output c(t) is applied to track-and-hold circuit 97' and to the continuous input of the multiplier 101'. Offset correction values are added to the outputs of the track-and-hold circuits 94', 96' and 97' via the summing nodes 102', 104' and 105'. The offset corrected outputs a'(t), b'(t) and c'(t) of the track-and-hold circuits 94', 96' and 97' are respectively coupled to one input of the summation circuits 106', 108', and 109'. The three track-and-hold circuit outputs are also coupled to the inputs of A/D converters 110' and 112' of the phase correction circuit 58' and the infinite track-and-hold circuit 60'. As before, the A/D converters 110' and 112' may be clocked by the output of the trigger circuit 24' after an appropriate amount of delay as represented by delays 116 and 117". A phase pointer calculator 118' in the phase correction circuit 58' receives the three digital phase values and generates a phase pointer value derived from the digital phase values. Separate phase lookup tables 120, one for each phase of the continuous sinusoidal signal, receives the pointer as an index into the respective tables. Each phase lookup table outputs a phase correction value based on the pointer index. The phase correction values from the tables 120' are coupled to digital-to-analog converters 122' that generate analog voltage values representative of the phase correction values. The digitized values are loaded into the D/A converters 122' in response to a clock signal that may be clocked by the output of the trigger circuit after an appropriate amount of delay as represented by delay 124'. The analog voltages are coupled to the appropriate summation circuits 106', 108' and 109'. The summation circuits 106, 108 and 109' sum the phase values from the track-and-hold circuits 94', 96' and 97' with the appropriate phase correction values and generate corrected phase values. The corrected phase values a'(t), b'(t) and c'(t) of the respective summation circuits 106', 108' and 109' are coupled to the first input ports of the multiplexers 136', 138' and 139'.

The digital phase values generated by A/D converter 112' in the infinite track-and-hold circuit 60' are coupled to a phase pointer generator 128 and a digital summation circuit 130'. The phase pointer calculator 128' generates a phase pointer value derived from the three digital phase values. Separate phase lookup tables 132', receives the pointer as an index into the respective tables. Each phase lookup table outputs a phase correction value based on the pointer index. The phase correction values from the tables 132' are coupled to the digital summation circuit 130'. The digital summation circuit combines the digital phase value from the A/D converters 112' with the respective phase correction values to generate digital phase corrected values. The digital phase corrected values are loaded into the digital-to-analog (D/A) converters 134'. The digitized values are loaded into the D/A converters 134 in response to delayed clock signal from the delay 125'. The D/A converters 134 generate analog voltages representative of corrected replica phase values. The analog voltages at the output of the D/A converters 134' a'(t), b(t) and c'(t) are coupled to the second input ports of the multiplexers 136', 138 and 139'. The output ports are coupled to the inverting and non-inverting differential inputs of the multipliers 98', 100' and 101'. During the first time period the multiplexers 136', 138 and 139' couple the corrected phase values to the multipliers 98', 100' and 101'. During the second time period the multiplexers 136', 138 and 139' couple the corrected replica phase values to the multipliers 98', 100' and 101'. The output signals from multipliers 98', 100' and 101' are coupled to a signal summation circuit 126' that sums the outputs together to produce an output signal having a predetermined startup phase relative to the trigger transition.

Figure 8:
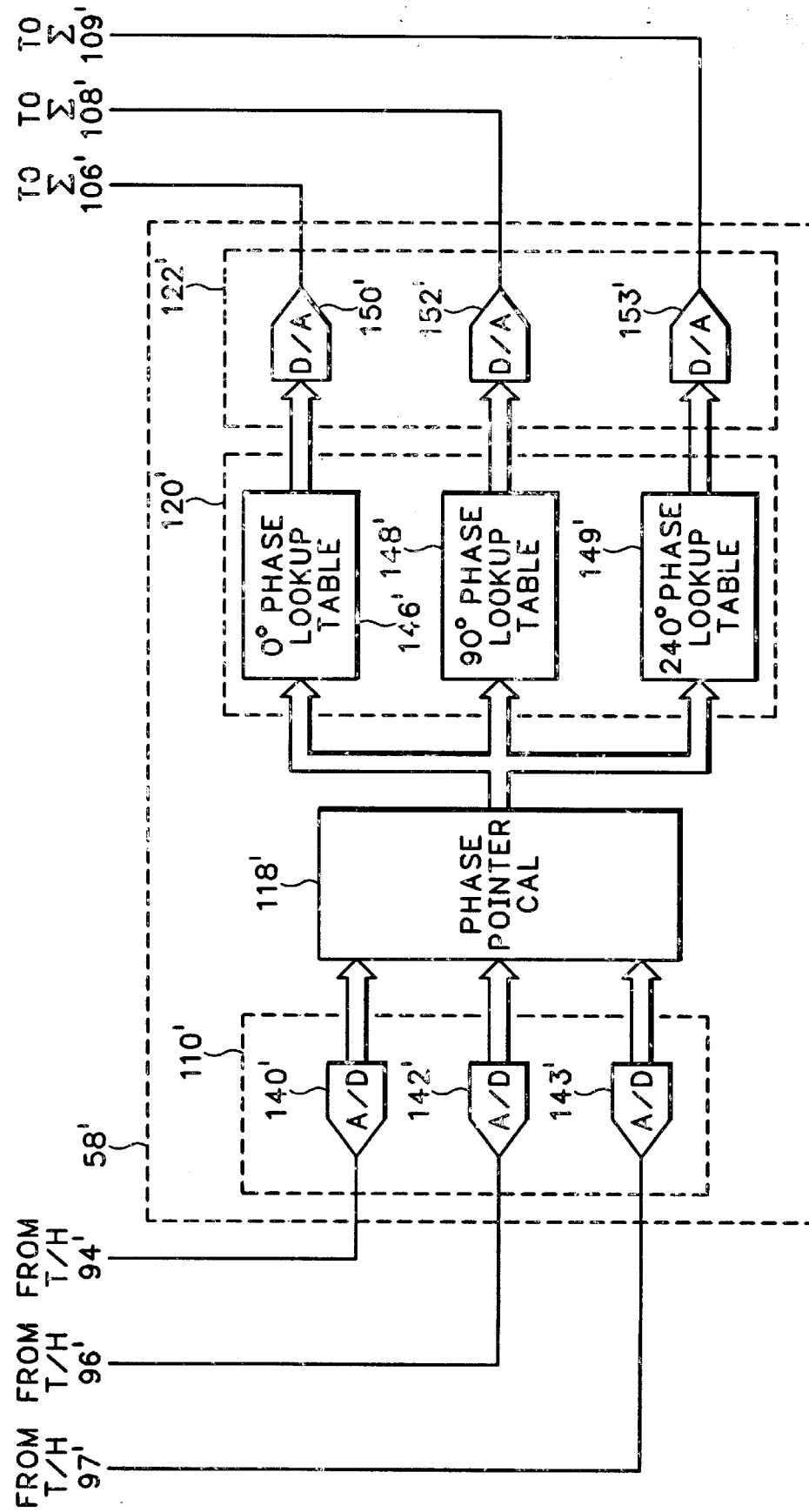
FIG. 8 is a representative block diagram of the phase correction circuit in the alternative embodiment of the phase startable clock device with deterministic phase error correction according to the present invention.

Referring to FIG. 8, there is shown the corresponding block diagram of the phase correction circuit 58 associated with a three phase gate. Like elements in the figure are labeled the same as in previous figures. The phase correction circuit 58' has first, second third A/D converters 140', 142' and 143' that are respectively coupled to receive the phase values at the output of the track-and-hold circuits 94', 96' and 97'. The A/D converters 140', 142' and 143' generate digital values representative of the held values at the outputs of the track-and-hold circuits 94', 96' and 97'. The respective digital phase values are coupled to the phase pointer calculator 118'. The phase pointer calculator 118' generates a pointer value derived from the three digital phase values and representative of the phase of the continuous wave oscillator signal at the time of the control signal input from the trigger circuit 24. The phase pointer value is used as an index into the phase lookup table 120'. The phase lookup table 120' includes separate tables for each phase shifted sinusoidal signal. In the circuit of FIG. 7, the phase shifted sinusoidal signal are in 0°, 120° and 240°. The 0°, 120° and 240° phase lookup tables 146', 148' and 149' are derived from acquired waveform record of a calibration signal and the digital phase values corresponding to each of the acquired samples in the waveform record. The phase pointer index value is applied to the phase lookup tables 146', 148' and 149' via the system bus 38. The phase correction value in the phase lookup table 146', indexed by the phase pointer index value, is output to D/A converter 150' the phase correction value in the phase lookup table 148', indexed by the phase pointer index value, is output to D/A converter 152' and the phase correction value in the phase lookup table 149', indexed by the phase pointer index value, is output to D/A converter 153'. The D/A converters 150', 152' and 153' convert the respective phase correction values to analog voltages that are coupled to summation circuits 106', 108' and 109' respectively.

Figure 9:
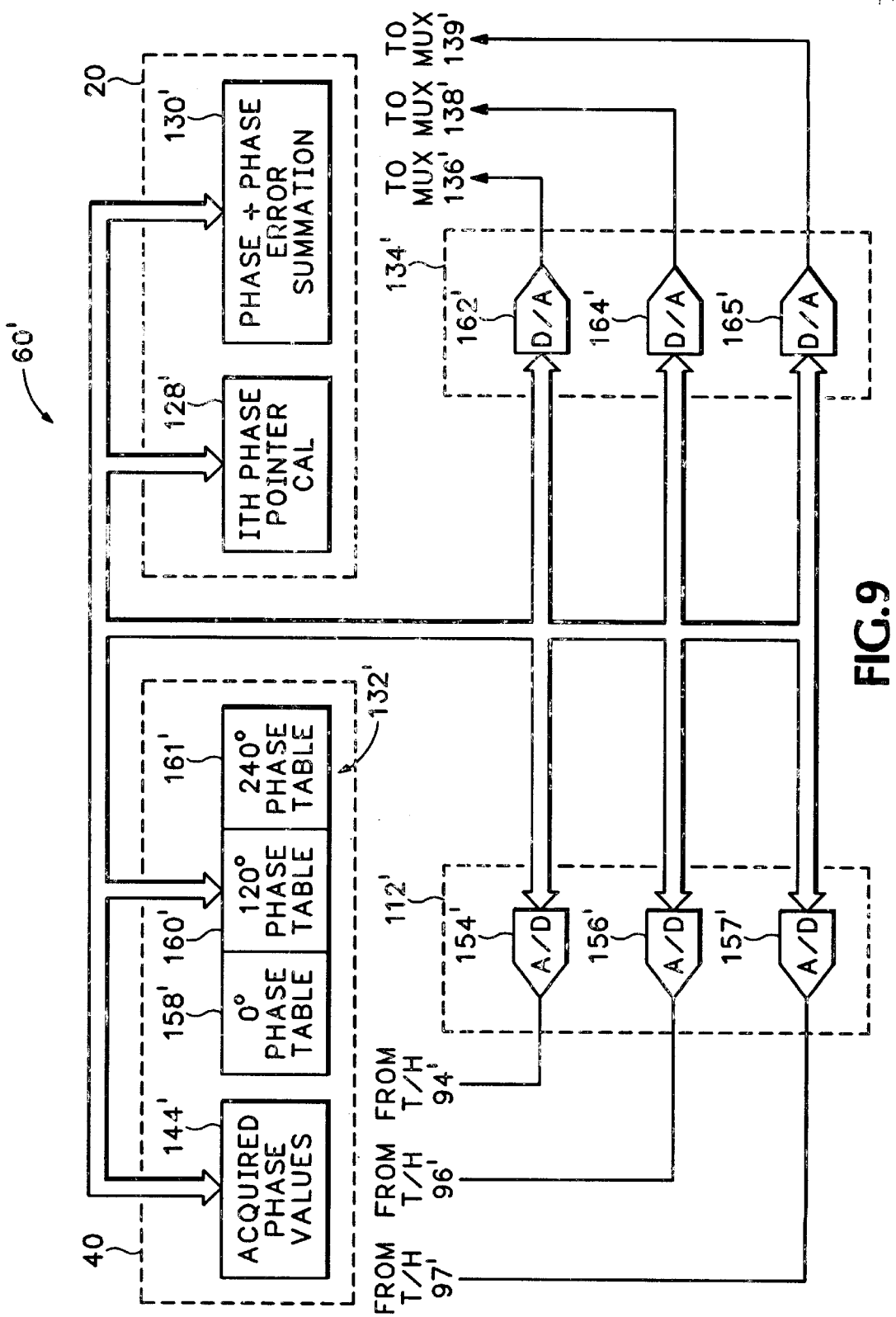
FIG. 9 is a representative block diagram of the infinite track-and-hold circuit in the alternative embodiment of the phase startable clock device with deterministic phase error correction according to the present invention.

The infinite track-and-hold circuit 60' of FIG. 9 has first, second and third A/D converters 154', 156 and 157' that are respectively coupled to receive the phase values at the output of the track-and-hold circuits 94', 96' and 97'. The A/D converters 154', 156' and 157' generate digital values representative of the held values at the outputs of the track-and-hold circuits 94', 96' and 97'. The digital phase values are coupled via the system bus 38 to the acquired phase value memory 144' in memory 40 and stored. The digital phase values from the respective A/D converter 154', 156' and 157' are read out of the phase value memory 144' and supplied to the phase pointer calculator 128'. The phase pointer calculator 128' generates a pointer value derived from the three digital phase values and representative of the phase of the continuous wave oscillator signal at the time of the control signal input from the trigger circuit 24. The phase pointer value is used as an index into the phase lookup table 132'. The phase lookup table 132' includes the 0°, 120° and 240° tables 158', 160' and 161'. The phase pointer index value is applied to the phase lookup tables 158', 160' and 161' via the system bus 38. Respective phase correction values are output from the phase lookup tables via the system bus 38 are coupled to summation circuit 130'. The stored phase values in phase value memory 144', corresponding the digital phase values from the A/D converters circuit 154', 156' and 157' are also coupled via the system bus 38 to the summation circuit 130'. The summation circuit 130' sums the digital phase values from the A/D converters 154', 156' and 157' with the respective phase correction values from the phase lookup tables 158', 160' and 161'. The resulting corrected replica phase values are coupled via the system bus 38 to respective D/A converter 162', 164' and 165'. The D/A converters 162', 164' and 165' generate analog voltages representing corrected replica phase value. The replica phase value analog voltages are coupled to the second input ports of the multiplexers 136', 138' and 139'.

Prior to the initiation of a trigger signal transition, the phase gate 56 tracks the phase shifted sinusoidal signals. The phase values at the output of the track-and-hold circuits 94', 96' and 97' are a'(t), b'(t) and c'(t) with the output of the phase gate 56 being a constant value. If the trigger signal transition to the hold state takes place at a time t=T, then a'(t), b'(t) and c'(t) are equal to constants a(T), b(T) and c(T) respectively. The phase gate outputs a signal with a predetermined startup phase relative to the trigger signal transition.

Figure 10A:
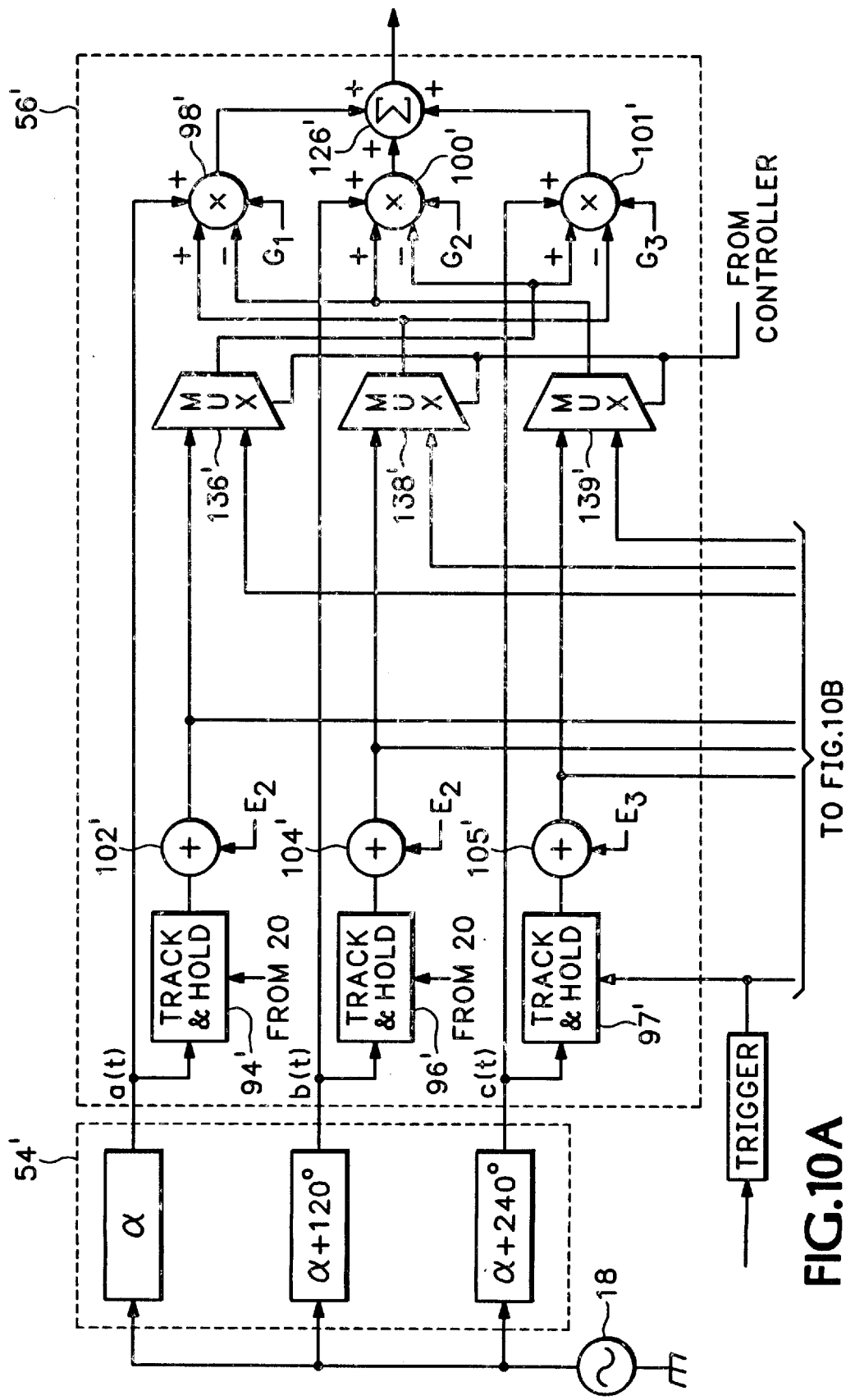
FIG. 10 is a representative block diagram of a further embodiment of the phase startable clock device with deterministic phase error correction according to the present invention.
Figure 10B:
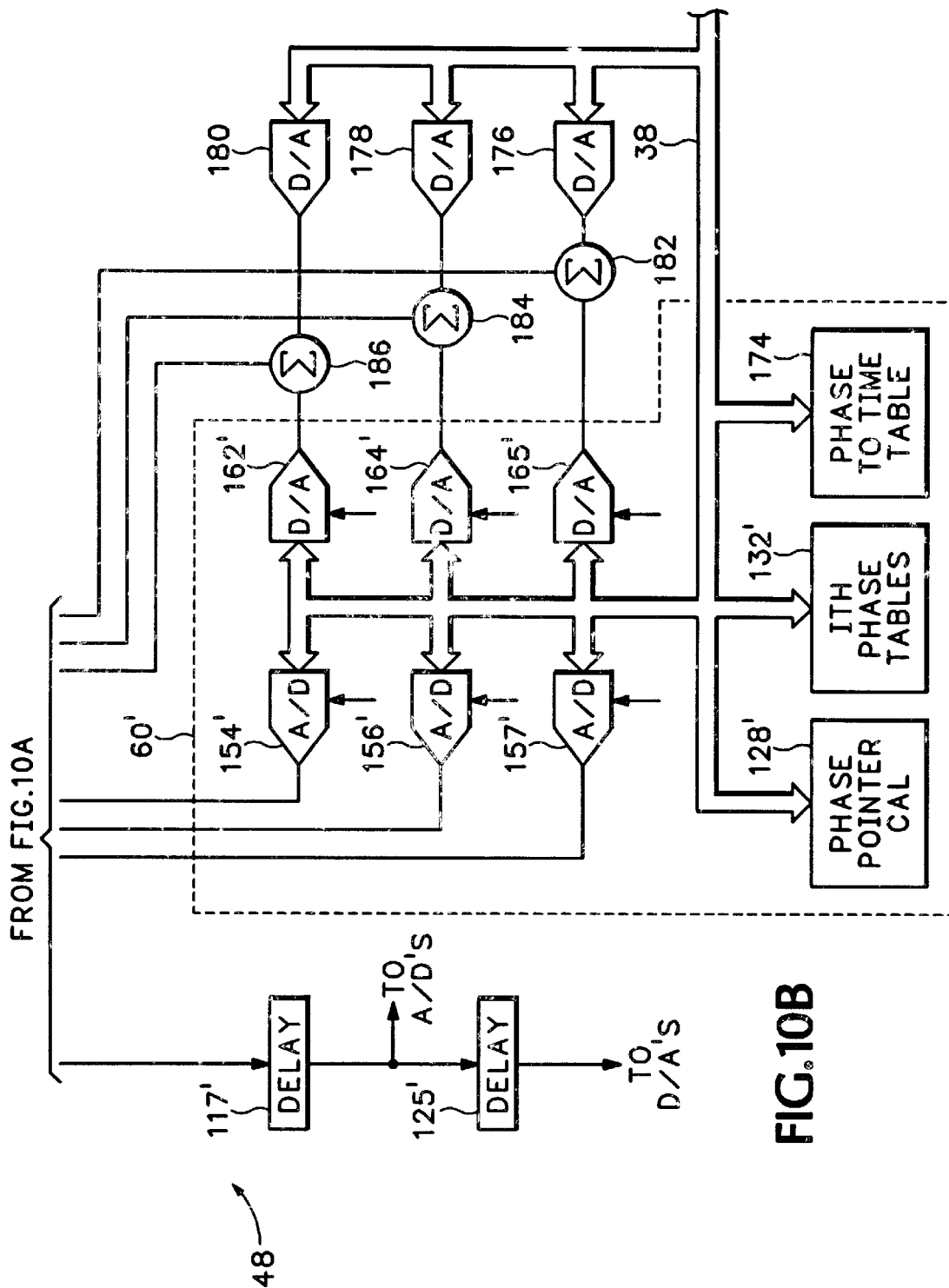

The above described phase startable clock device requires the use of high speed circuitry and processes to generate the phase correction values prior to the initiation of a next trigger signal transition. Such high speed circuitry generally requires the design and fabrication of ASIC circuitry. The phase startable clock device of FIG. 10 illustrates a phase startable clock device where the high speed phase correction circuit 58 is replaced with a time-error-phase lookup table 170. Elements in FIG. 10 are labeled the same as in previous drawing figures. The infinite track-and-hold circuit 60' functions in a similar way as the previously described infinite track-and-hold circuit. The A/D converters 154', 156' and 157' digitized the phase values held on the track-and-hold circuits 94', 96' and 97'. The digitized phase values are coupled to the D/A converter 162', 164' and 165' and the phase pointer calculator 128' via the system bus 38 from the phase value memory 144'. The D/A converters generate replica analog voltages representative of the phase values held on the track-and-hold circuits 154', 156' and 157'. The replica analog voltages are respectively coupled to inputs of summation circuits 182, 184 and 186. The phase pointer calculator generates the phase pointer value that is used to index the phase lookup tables 132'. The phase correction values output by the phase lookup table 132' are coupled to the D/A converters 176, 178 and 180 via the system bus 38. The D/A converters 176, 178 and 180 generate analog voltages representative of the phase correction values. The analog phase correction voltages from the D/A converters 176, 178 and 180 are respectively coupled to the summation circuits 182, 184 and 186. The summation circuit 182, 184 and 186 combine the replica phase value voltage with the phase correction voltages to generate corrected replica phase value voltages. The corrected replica phase value voltages are coupled to the respective input ports of the multiplexers 136', 138' and 139'.

The time-error phase lookup table 174 receives the phase pointer value from the phase pointer calculator 128'. The phase pointer value indexes into the time-error phase lookup table 170 and outputs a time value that is used to adjust the time location of the waveform sample acquired with the strobe pulse generated using the output signal from the phase gate 56. The phase-time lookup table 170 is used in place of the phase correction circuit 58 during the first time period of the phase gate 56 output signal generation. The infinite track-and-hold circuit 60 is used during the second time period of the output signal generation.

A phase startable clock device and associated equivalent time digitizing instrument has been described having a phase correction circuit and an associated optional infinite track-and-hold circuit. The phase startable clock device includes a phase gate having track-and-hold circuits that capture and hold phase values of input phase shifted sinusoidal signals at trigger signal transitions. The held phase values are coupled to respective summation circuits, the phase correction circuit and the infinite track-and-hold circuits. The phase correction circuit and the infinite track-and-hold circuit includes A/D converters that digitize the captured and held phase values from track-and-hold circuits. The digitized phase values the respective A/D converters are applied to respective phase pointer calculators that each generate a phase pointer. The phase pointer value in the phase correction circuit is indexes into phase lookup tables equaling the number of phase shifted sinusoidal signal applied to the phase gate. The phase lookup tables contains phase correction values representative of deterministic phase error in the phase gate. The phase lookup tables output phase correction values that are converted to analog signal and coupled to the summation circuits. The summation circuits combine the held phase values with the phase correction values and apply the corrected phase values to multipliers. The multipliers, who each receive one of the phase shifted sinusoidal signals generated output signals that are summed in a signal summation circuit to generate an output signal with a predetermined startup phase relative to the control input signal transition.

The phase pointer value in the infinite track-and-hold circuit indexes into a phase lookup table that outputs a phase correction value. The phase correction value is combined with one of the digital phase values to generate a digital corrected phase value. The digital corrected phase value is converted to an analog corrected replica phase value by a digital-to-analog converter and applied to a second input port of a multiplexer. The other held phase value is converted to an analog replica phase value by another digital-to-analog converter and coupled to the second input port of another multiplexer. The first input port of the multiplexers are coupled to receive the held phase values on the track-and-hold circuits. The multiplexers selectively couples the held phase values to corresponding multipliers during a first time interval and the analog replica phase value and corrected replica phase value during a second time interval. The multipliers generate output signals that are summed in a summation circuit to generate an output signal with a predetermined startup phase relative to the control input signal transition.

The time-error phase lookup table may be substituted for the phase correction circuit. In such an implementation, the time-error phase lookup table provides time adjustments for acquired waveform samples. The time adjustment values are used to adjust the time of the acquired samples in a waveform record.

It will be obvious to those having skill in the art that many changes may be made to the details of the above-described embodiments of this invention without departing from the underlying principles thereof. The scope of the present invention should, therefore, be determined only by the following claims.

What is claimed is:

1. A phase startable clock device having deterministic phase error correction and receiving phase shifted continuous sinusoidal signals derived from a continuous sinusoidal signal from a continuous wave oscillator comprising:

a phase gate having at least first and second track-and-hold circuits and first and second multipliers with each track-and-hold circuit and multiplier coupled to receive one of first and second phase shifted continuous sinusoidal signals;

the first and second track-and-hold circuits coupled to receive a control input signal having a transition between a first state and a second state to capture and hold respective phase values of the sinusoidal signals;

at least first and second analog-to-digital converters with the first analog-to-digital converter coupled to receive the held phase value on the first track-and-hold circuit and the second analog-to-digital converter coupled to receive the held phase value on the second track-and-hold circuit and each analog-to-digital converter generating a digital phase value representative of the respective held phase values;

a phase pointer generator coupled to receive the digital phase values and generating a phase pointer value derived from the held phase values and representing the phase of the continuous sinusoidal signal from the continuous wave oscillator;

at least first and second phase lookup tables with each phase lookup table containing phase correction values representative of deterministic phase error in the phase gate with each table receiving the pointer value from which a phase correction value is output from each table;

at least first and second digital-to-analog converters with the first digital-to-analog converter coupled to receive the phase correction value from the first phase lookup table and the second digital-to-analog converter coupled to receive the phase correction value from the second phase lookup table and each digital-to-analog converter generating an analog voltage representative of the received phase correction value;

at least first and second summation circuits with the first summation circuit coupled to receive the phase value held on the first track-and hold circuit and the analog voltage from the first digital-to-analog converter and the second summation circuit coupled to receive the phase value held on the second track-and hold circuit and the analog voltage from the second digital-to-analog converter and each summation circuit generating a corrected phase value;

the first and second multipliers selectively receiving the corrected phase value from the first and second summation circuits and generating continuous sinusoidal output signals; and a signal summing circuit coupled to receive respective output signals from the multipliers to generate an output signal with a predetermined startup phase relative to the control input signal transition.

2. The phase startable clock device as recited in claim 1 further comprising:

an infinite track-and hold circuit comprising:

at least first and second analog-to-digital converters coupled to receive the respective phase values at the outputs of the first and second track-and-hold circuits with each analog-to-digital converter generating a digital phase value representative of the held phase values;

a phase pointer generator coupled to receive the digital phase values and generating a phase pointer value derived from the held phase values and representing the phase of the continuous sinusoidal signal from the continuous wave oscillator;

at least first and second phase lookup tables with each phase lookup table containing phase correction values representative of deterministic phase error in the phase gate with each table receiving the pointer value from which a phase lookup correction value is output; and at least first and second digital summation circuits with the first summation circuit receiving the digital phase value from the first analog-to-digital converter and the first phase lookup correction value from the first phase lookup table and the second digital summation circuit receiving the second digital phase value from the second analog-to-digital converter and the second phase lookup correction value from the second phase lookup table and generating first and second corrected replica phase values; and at least first and second digital-to-analog converters with the first digital-to-analog converter coupled to receive the first corrected phase value and the second digital-to-analog converter coupled to receive the second corrected phase value and generating respective first and second analog voltages representative of the corrected replica phase values.

3. The phase startable clock device as recited in claim 2 further comprising at least first and second multiplexers with the first multiplexer coupled to receive the corrected phase value from the first summation circuit at a first input port and a corrected replica phase value from the first digital-to-analog converter at a second input port and the second multiplexer coupled to receive the corrected phase value from the second summation circuit at a first input port and the corrected replica phase value from the second digital-to-analog converter at a second input port wherein the first and second multiplexers selectively couple the corrected phase values to the multipliers via respective output ports during the first time interval and the corrected replica phase values during the second time interval.

4. The phase startable clock device as recited in claim 1 further comprising a phase splitter receiving a continuous sinusoidal signal and generating the phase shifted continuous sinusoidal signals.

5. The phase startable clock device as recited in claim 1 further comprising at least first and second offset summing circuits with each offset summing circuit coupled to one of the outputs of the first and second track-and-hold circuits and further coupled to receive an offset correction value.

6. The phase startable clock device as recited in claim 1 wherein the first and second multipliers are each coupled to receive a gain correction value.

7. The phase startable clock device as recited in claim 1 wherein the first and second multipliers are four quadrant multipliers.

8. The phase startable clock device as recited in claim 1 further comprising:

a phase splitter coupled to receive a continuous sinusoidal signal and generating first, second, and third phase shifted continuous sinusoidal signals a(t), b(t), and c(t) of predetermined phases;

a third track-and-hold circuit and a third multiplier coupled to receive the third phase shifted sinusoidal signal c(t) with the first and second track-and-hold circuits respectively coupled to receive the first and second phase shifted sinusoidal signals a(t) and b(t) and the third track-and-hold circuit coupled to receive the control input signal to capture and hold a phase value of the third phase shifted sinusoidal signal;

the phase pointer generator coupled to receive the digital values of the held phase values and generating a phase pointer value derived from the held phase values;

a third phase lookup table containing phase correction values representative of deterministic phase error in the phase gate and receiving the pointer value derived from the held phase values from which a phase correction value for the third track-and-hold is output;

a third digital-to-analog converter coupled to receive the phase correction value from the third phase lookup table and generating an analog voltage representative of the phase correction value;

a third summation circuit coupled to receive the phase value held on the third track-and-hold circuit and the analog voltage from third digital-to-analog converter and generating a third corrected phase value;

the first and second multipliers receiving the corrected phase value from the third summation circuit and the third multiplier receiving the corrected phase values from the first and second summation circuits and generating a continuous sinusoidal output signal; and the first multiplier multiplying the first phase shifted sinusoidal by b(T)–c(T) to produce a first product signal, the second multiplier multiplying the second phase shifted sinusoidal by c(T)–a(T) to produce a second product signal and a third multiplier multiplying the third phase shifted sinusoidal signal by a(T)–b(T) to produce a third product signal with the signal summing circuit coupled to receive respective product signals from the multipliers to generates the output signal wherein a(T), b(T) and c(T) are the values of the first, second and third phase shifted sinusoidal signals at the time of the control input signal transition.

9. The phase startable clock device as recited in claim 1 further comprising: an infinite track-and hold circuit comprising:
at least first, second and third analog-to-digital converters coupled to receive the respective phase value at the outputs of the first, second, and third track-and-hold circuits with each analog-to-digital converter generating a digital phase value representative of the phase value of the held phase;
a phase pointer generator coupled to receive the digital phase values and generating a phase pointer value derived from the held phase values and representing the phase of the continuous sinusoidal signal from the continuous wave oscillator;
at least first, second and third phase lookup tables with each phase lookup table containing phase lookup correction values representative of deterministic phase error in the phase gate with each table receiving the pointer value from which a phase lookup correction value is output; and
at least first, second and third digital summation circuits with the first summation circuit receiving the digital phase value from the first analog-to-digital converter and the first phase lookup correction value from the first phase lookup table, the second digital summation circuit receiving the second digital phase value from the second analog-to-digital converter and the second phase lookup correction value from the second phase lookup table and the third summation circuit receiving the digital phase value from the third analog-to-digital converter and the third phase lookup correction value from the third phase lookup table and generating first, second and third corrected replica phase values; and
at least first, second and third digital-to-analog converters with the first digital-to-analog converter coupled to receive the first corrected phase value, the second digital-to-analog converter coupled to receive the second corrected phase value and the third digital-to-analog converter coupled to receive the third corrected phase value and generating respective first, second and third analog voltages representative of the corrected replica phase values.

10. The phase startable clock device as recited in claim 9 further comprising at least first, second and third multiplexers with the first multiplexer coupled to receive the corrected phase value from the first summation circuit at a first input port and a corrected replica phase value from the first digital-to-analog converter at a second input port, the second multiplexer coupled to receive the corrected phase value from the second summation circuit at a first input port and the corrected replica phase value from the second digital-to-analog converter at a second input port and the third multiplexer coupled to receive the corrected phase value from the third summation circuit at a first input port and the corrected replica phase value from the third digital-to-analog converter at a second input port wherein the first, second and third multiplexers selectively couple the corrected phase values to the multipliers via respective output ports during the first time interval and the corrected replica phase values during the second time interval.

11. The phase startable clock device as recited in claim 8 further comprising first, second and third offset summing circuits with each offset summing circuit coupled to one of the outputs of the first, second and third track-and-hold circuits and further coupled to receive an offset correction value.

12. The phase startable clock device as recited in claim 8 wherein the first, second and third multipliers are each coupled to receive a gain correction value.

13. The phase startable clock device as recited in claim 8 wherein the first, second and third multipliers are four quadrant multipliers.

14. The phase startable clock device as recited in claim 8 wherein the predetermined phase of the first, second and third phase shifted sinusoidal signals are 0°, 120°, and 240° respectively.

15. An equivalent time sampling digitizing instrument having pre and post acquisition phase error correction comprising:
an acquisition system responsive to variable delay sampling strobe pulses for acquiring waveform samples of an input signal under test;
timebase circuitry that generates the variable delay sampling strobe pulses in response to a control input signal having a transition between a first state and a second state;
the timebase circuitry comprising:
a continuous wave oscillator generating a continuous sinusoidal signal;
a phase splitter receiving the continuous sinusoidal signal and generating at least first and second phase shifted continuous sinusoidal signals;
a phase gate having at least first and second track-and-hold circuits and first and second multipliers with each track-and-hold circuit and multiplier coupled to receive one of the first and second phase shifted continuous sinusoidal signals;
the first and second track-and-hold circuits coupled to receive a control input signal having a transition between a first state and a second state to capture and hold respective phase values of the sinusoidal signals;
an infinite track-and hold circuit coupled to receive the held phase values at the outputs of the track-and-hold circuits and generating first and second digital values of the held phase values and first and second analog replica phase values of the respective phase values from the digital values;
the infinite track-and-hold circuit having a phase pointer generator coupled to receive the digital phase values and generating a phase pointer value derived from the held phase values and representing the phase of the continuous sinusoidal signal from the continuous wave oscillator;

the infinite track-and-hold having at least first and second phase lookup tables with each phase lookup table containing phase correction values representative of deterministic phase error in the phase gate with each table receiving the pointer value from which a phase correction value is output;

the infinite track-and-hold having at least first and second digital-to-analog converters with the first digital-to-analog converter coupled to receive the phase correction value from the first phase lookup table and the second digital-to-analog converter coupled to receive the phase correction value from the second phase lookup table, the first and second digital-to-analog converters generating first and second analog phase correction values respectively;

at least first and second summation circuits with the first summation circuit coupled to receive the first analog phase correction value and the first analog replica phase value from the infinite track-and-hold circuit and the second summation circuit coupled to receive the second analog phase correction value and the second analog replica phase value, each summation circuit generating a corrected replica phase value;

the infinite track-and-hold circuit having at least first and second multiplexers with the first multiplexer coupled to receive the phase value held on the first track-and-hold circuit and the corrected replica phase value from the first summation circuit and the second multiplexer coupled to receive the phase value held on the second track-and-hold circuit and the corrected replica phase value from the second summation circuit;

the first and second multiplexers selectively coupling the phase values to the multipliers during a first time period and the corrected replica phase values during a second time period;

a signal summing circuit coupled to receive respective output signals from the multipliers to generate an output signal with a predetermined startup phase relative to the control input signal transition;

a strobe generator having coarse time delay circuitry and fine time delay circuitry with the coarse time delay circuitry receiving a first portion of a strobe delay input for loading a counter with a coarse time delay value and the fine time delay circuitry receiving a second portion of the strobe delay input for generating an analog input signal to an interpolator in the fine time delay circuitry derived from a fine time delay lookup table of digital values with the coarse time delay circuitry responsive to the output signal for the summing circuit and the interpolator responsive to the analog signal for generating the variable time delay strobe output pulses; and a phase-time lookup table containing timing error correction values and receiving the pointer value derived from the held phase values from which is output a timing error correction value that adjusts the time position of the waveform samples during the first time period when the phase values of the first and second track-and-hold circuits are coupled to the multipliers.

16. The equivalent time sampling digitizing instrument as recited in claim 15 wherein the infinite track-and-hold circuit comprises:

at least first and second analog-to-digital converters with each analog-to-digital converter coupled to receive one of the phase values at the output of the first and second track-and-hold circuits and generating the digital values representative of the phase values; and at least first and second digital-to-analog converters with each digital-to-analog converter coupled to receive one of the digital values from the analog-to-digital converters and generating the replica analog phase values.

17. The equivalent time sampling digitizing instrument as recited in claim 15 further comprising a phase splitter receiving a continuous sinusoidal signal and generating the phase shifted continuous sinusoidal signals.

18. The equivalent time sampling digitizing instrument as recited in claim 15 further comprising at least first and second offset summing circuits with each offset summing circuit coupled to one of the outputs of the first and second track-and-hold circuits and further coupled to receive an offset correction value.

19. The equivalent time sampling digitizing instrument as recited in claim 15 wherein the first and second multipliers are each coupled to receive a gain correction value.

20. The equivalent time sampling digitizing instrument as recited in claim 15 wherein the first and second multipliers are four quadrant multipliers.

21. The equivalent time sampling digitizing instrument as recited in claim 15 wherein the first time period in which the multiplexers couple the track-and-hold phase values to the multipliers is in the range of 10 microseconds or less.

22. The equivalent time sampling digitizing instrument as recited in claim 21 wherein the second time period in which the multiplexers couple the replica phase values to the multipliers is in the range of greater than 10 microseconds.

23. The equivalent time sampling digitizing instrument as recited in claim 15 further comprising:

a phase splitter coupled to receive a continuous sinusoidal signal and generating first, second, and third phase shifted continuous sinusoidal signals a(t), b(t), and c(t) of predetermined phases;

a third track-and-hold circuit coupled to receive the third phase shifted sinusoidal signal c(t) with the first and second track-and-hold circuits respectively coupled to receive the first and second phase shifted sinusoidal signals a(t) and b(t) and the third track-and-hold circuit coupled to receive the control input signal to capture and hold a phase value of the third phase shifted sinusoidal signal;

the infinite track-and-hold circuit coupled to receive the phase value at the output of the third track-and-hold circuit and generating a third digital value of the held phase value and an third analog replica phase value of the phase value from the third digital phase value;

the phase pointer generator coupled to receive the digital values of the held phase values and generating a phase pointer value derived from the held phase values and representing the phase of the continuous sinusoidal signal from the continuous wave oscillator;

the infinite track-and-hold circuit having a third phase lookup table containing phase correction values representative of deterministic phase error in the phase gate and receiving the phase pointer value from which a phase correction value is output;

the infinite track-and-hold circuit having a third digital-to-analog converter coupled to receive the phase lookup correction value from the third phase lookup table and generating a third analog phase correction value;

a third summation circuit coupled to receive the third analog phase correction value and the third analog replica phase value and generating a corrected replica phase value;

the infinite track-and-hold having a third multiplexer having a first input port coupled to receive the held phase value on the third track-and-hold circuit and a second input port coupled to receive the corrected replica phase value from the third summation circuit;

the third multiplexer selectively coupling the held phase value to the multipliers via an output port during a first time period and the corrected replica phase value during a second time period;

the first multiplier multiplying the first phase shifted sinusoidal by b(T)−c(T) to produce a first product signal, the second multiplier multiplying the second phase shifted sinusoidal by c(T)−a(T) to produce a second product signal and a third multiplier multiplying the third phase shifted sinusoidal signal by a(T)−b(T) to produce a third product signal with the summing circuit coupled to receive respective product signals from the multipliers to generates the output signal wherein a(T), b(T) and c(T) are the values of the first, second and third phase shifted sinusoidal signals at the time of the control input signal transition; and the phase-time lookup table containing timing correction values and receiving the pointer value and outputting a timing error correction value that adjusts the time position of the waveform samples during the first time period when the phase values of the first, second and third track-and-hold circuits are coupled to the multipliers.

24. The equivalent time sampling digitizing instrument as recited in claim 23 wherein the infinite track-and-hold circuit comprises:

at least first, second and third analog-to-digital converters with each analog-to-digital converter coupled to receive one of the phase values at the output of the first, second and third track-and-hold circuits and generating the digital value representative of the phase values; and at least first, second and third digital-to-analog converters with each digital-to-analog converter coupled to receive one of the digital values from the analog-to-digital converters and generating the replica analog phase values.

25. The equivalent time sampling digitizing instrument as recited in claim 23 further comprising first, second and third offset summing circuits with each offset summing circuit coupled to one of the outputs of the first, second and third track-and-hold circuits and further coupled to receive an offset correction value.

26. The equivalent time sampling digitizing instrument as recited in claim 23 wherein the first, second and third multipliers are each coupled to receive a gain correction value.

27. The equivalent time sampling digitizing instrument as recited in claim 23 wherein the first, second and third multipliers are four quadrant multipliers.

28. The equivalent time sampling digitizing instrument as recited in claim 23 wherein the predetermined phase of the first, second and third phase shifted sinusoidal signals are 0°, 120°, and 240° respectively.

* * * * *